(12) United States Patent
Zidan et al.

(10) Patent No.: US 10,297,318 B2
(45) Date of Patent: May 21, 2019

(54) COMPENSATED READOUT OF A MEMRISTOR ARRAY, A MEMRISTOR ARRAY READOUT CIRCUIT, AND METHOD OF FABRICATION THEREOF

(71) Applicant: KING ABDULLAH UNIVERSITY OF SCIENCE AND TECHNOLOGY, Thuwal (SA)

(72) Inventors: Mohammed Affan Zidan, Thuwal (SA); Hesham Omran, Thuwal (SA); Ahmed Sultan Salem, Thuwal (SA); Khaled Nabil Salama, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 15/735,978

(22) PCT Filed: Jun. 15, 2016

(86) PCT No.: PCT/IB2016/053540
§ 371 (c)(1),
(2) Date: Dec. 13, 2017

(87) PCT Pub. No.: WO2016/203397
PCT Pub. Date: Dec. 22, 2016

(65) Prior Publication Data
US 2018/0166134 A1 Jun. 14, 2018

Related U.S. Application Data

(60) Provisional application No. 62/180,675, filed on Jun. 17, 2015.

(51) Int. Cl.
*G11C 13/00* (2006.01)
*G11C 27/02* (2006.01)

(52) U.S. Cl.
CPC .......... *G11C 13/004* (2013.01); *G11C 13/003* (2013.01); *G11C 13/0007* (2013.01);
(Continued)

(58) Field of Classification Search
CPC . G11C 13/004; G11C 13/0007; G11C 13/003; G11C 27/024; G11C 2013/0054; G11C 2013/0057; G11C 2213/79
(Continued)

(56) References Cited

U.S. PATENT DOCUMENTS 3,699,545 A * 10/1972 Kluge .............. G06F 17/30982
365/49.1
2011/0286259 A1* 11/2011 Perner ................... G11C 5/063
365/148
(Continued)

OTHER PUBLICATIONS

Zidan et al., "Compensated Readout for High-Density MOS-Gated Memristor Crossbar Array," Jan. 2015; IEEE Transactions on Nanotechnology, all pages (Year: 2015).*
(Continued)

*Primary Examiner* — Fernando Hidalgo
(74) *Attorney, Agent, or Firm* — Patent Portfolio Builders PLLC

(57) ABSTRACT

A method for readout of a gated memristor array, a memristor array readout circuit and method of fabrication thereof are provided. In the context of the method, the method includes selecting a row of a memristor array associated with a desired cell, measuring the value of the selected memristor row, and selecting a column of a memristor array associated with the desired cell. The selection of the column and selection of the row selects the desired cell. The method also includes measuring the value of the memristor selected row with the selected desired cell and determining the value of the desired cell based on the value of the selected
(Continued)

memristor row and the value of the selected memristor row with the selected desired cell.

20 Claims, 13 Drawing Sheets

(52) U.S. Cl.
CPC .... *G11C 27/024* (2013.01); *G11C 2013/0054* (2013.01); *G11C 2013/0057* (2013.01); *G11C 2213/79* (2013.01)

(58) Field of Classification Search
USPC ....... 365/46, 55, 74, 97, 100, 131, 148, 158, 365/171, 173, 16
See application file for complete search history.

(56) References Cited

U.S. PATENT DOCUMENTS

2012/0314477 A1* 12/2012 Siau .................... G11C 8/08 365/148
2015/0280118 A1* 10/2015 Lee ..................... H01L 45/141 438/382

OTHER PUBLICATIONS

International Search Report and Written Opinion of International Searching Authority for International Patent Application No. PCT/IB2016/053540 dated Aug. 30, 2016.
Kim, K. H., et al. "A Functional Hybrid Memristor Crossbar-Array/CMOS System for Data Storage and Neuromorphic Applications." Nano Letters, vol. 12, No. 1, Dec. 5, 2011, pp. 389-395.
Liang, J. et al. "Effect of Wordline/Bitline Sealing on the Performance, Energy Consumption, and Reliability of Cross-Point Memory Array"; ACM Journal of Emerging Technologies in Computing Systems, vol. 9, Issue 1, Feb. 2013, p. 9.
Vontobel et al. "Writing to and reading from a nano-scale crossbar memory based on memristors." Nanotechnology, vol. 20, No. 42, Oct. 21, 2009, 21 pages.
Zidan, M. A., et al. "Compensated Readout for High-Density MOS-Gated Memristor Crossbar Array." IEEE Transactions on Nanotechnology, vol. 14, Issue 1, Jan. 2015, 3 pages.
Zidan, M., A.,, et al.; "Memristor-based Memory: The Sneak Paths Problem and Solutions." Microelectronics Journal, vol. 44, Issue 2, Feb. 2013, pp. 176-183.
Zidan, M. A.; "Memristor Circuits and Systems." [retrieved Mar. 20, 2018] Retrieved from the Internet: <URL: http://repository.kaust.edu.sa/kaust/bitstream/10754/552716/1/Mohammed_Zidan_PhD_Thesis_May_2015.pdf> (dated May 31, 2015), 163 pages.

* cited by examiner

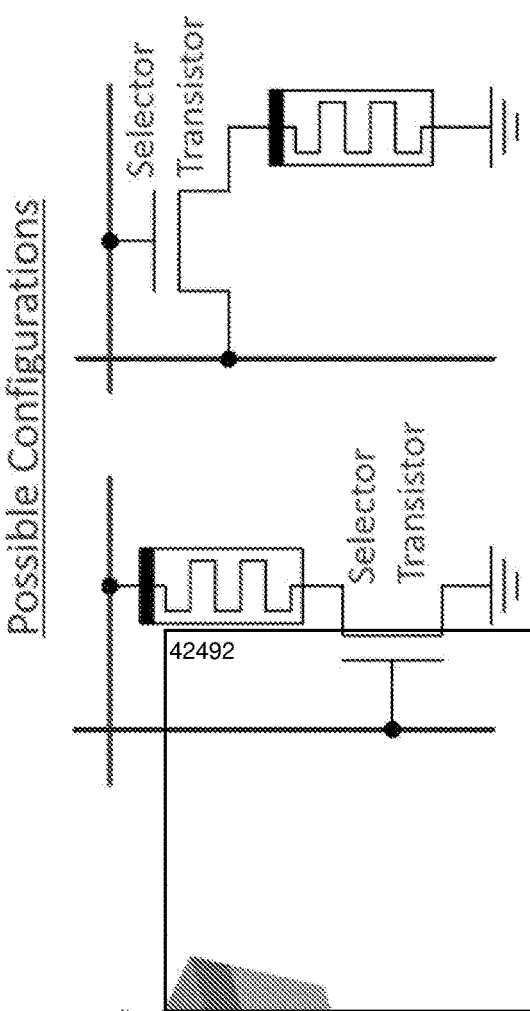
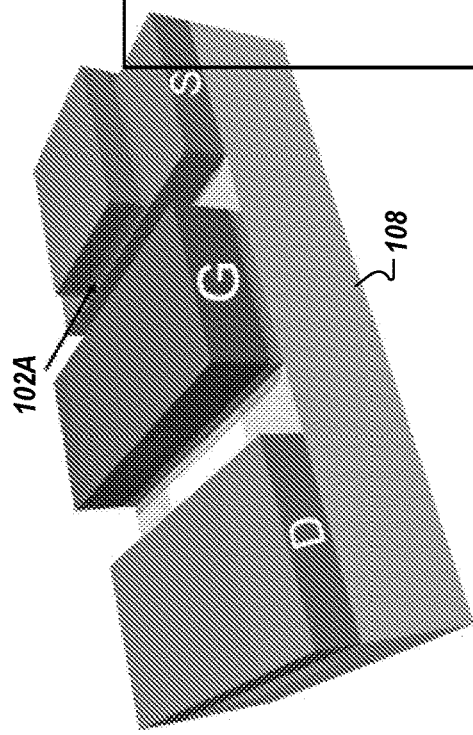
Figure 1C
Figure 1D

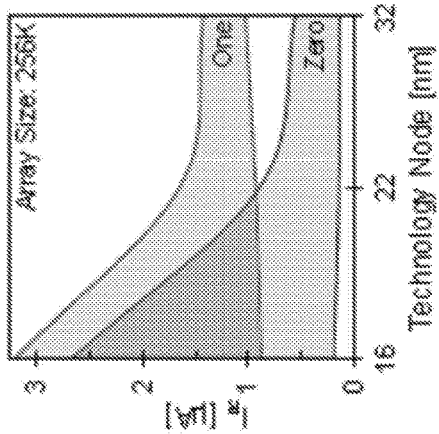
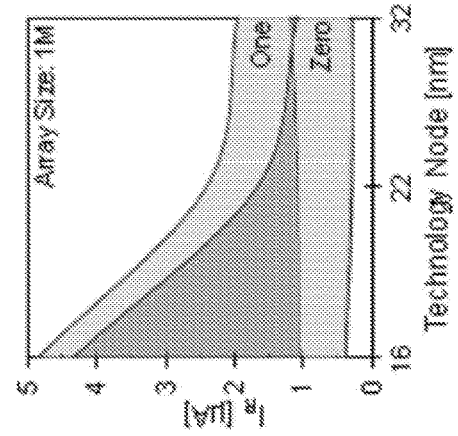
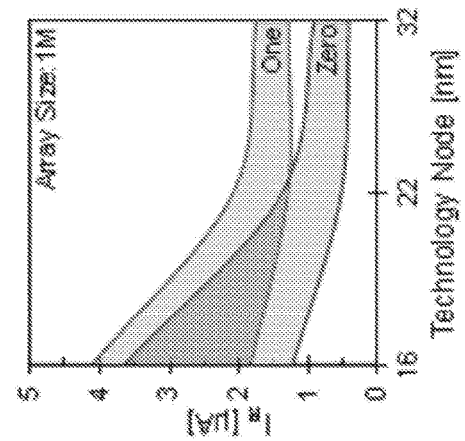
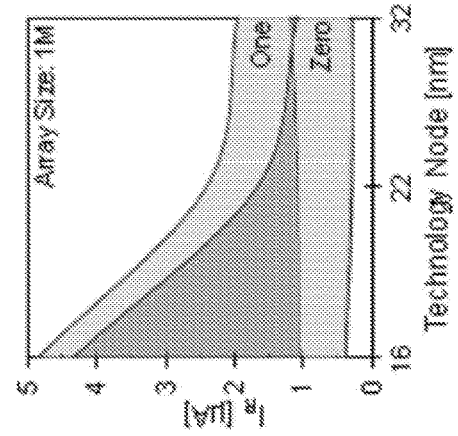
Figure 6A – NIST data
Figure 6B – "all ones" and "all zeros"
Figure 6C – NIST data
Figure 6D – "all ones" and "all zeros"

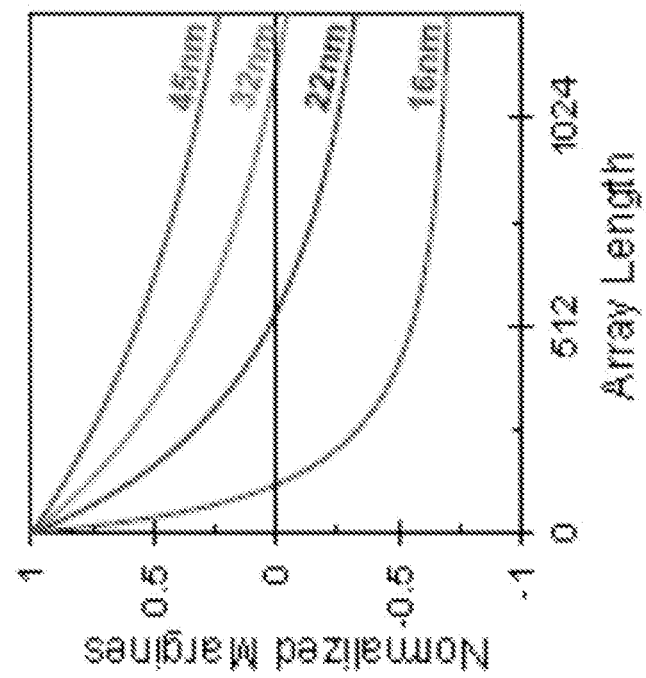
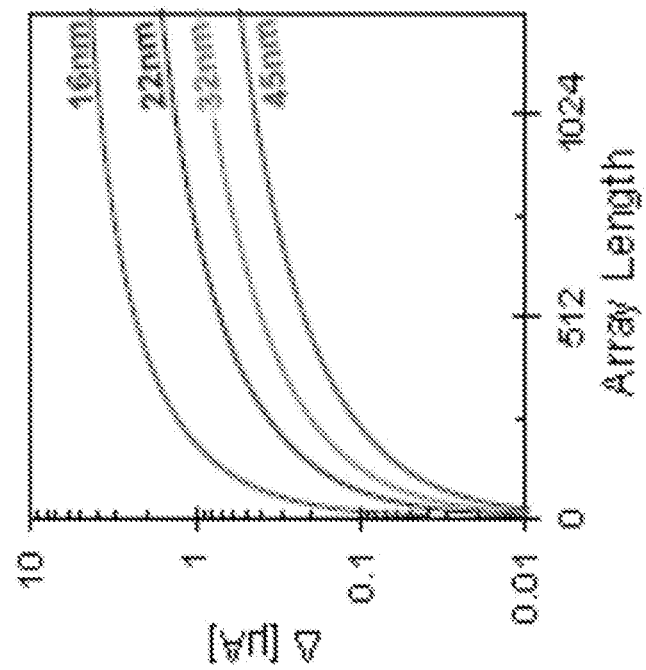
Figure 7B
Figure 7A

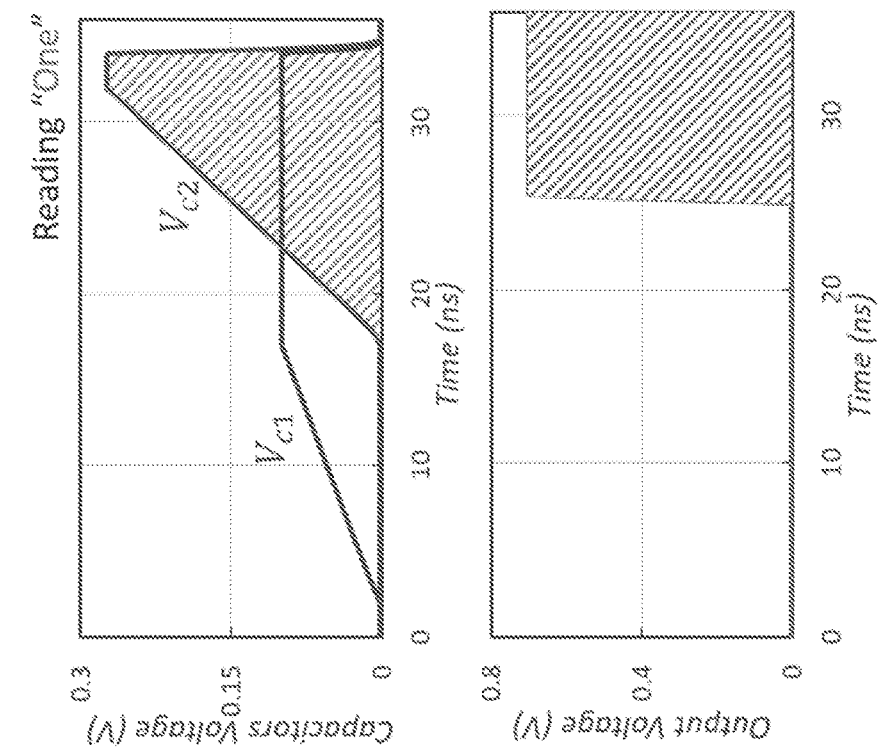
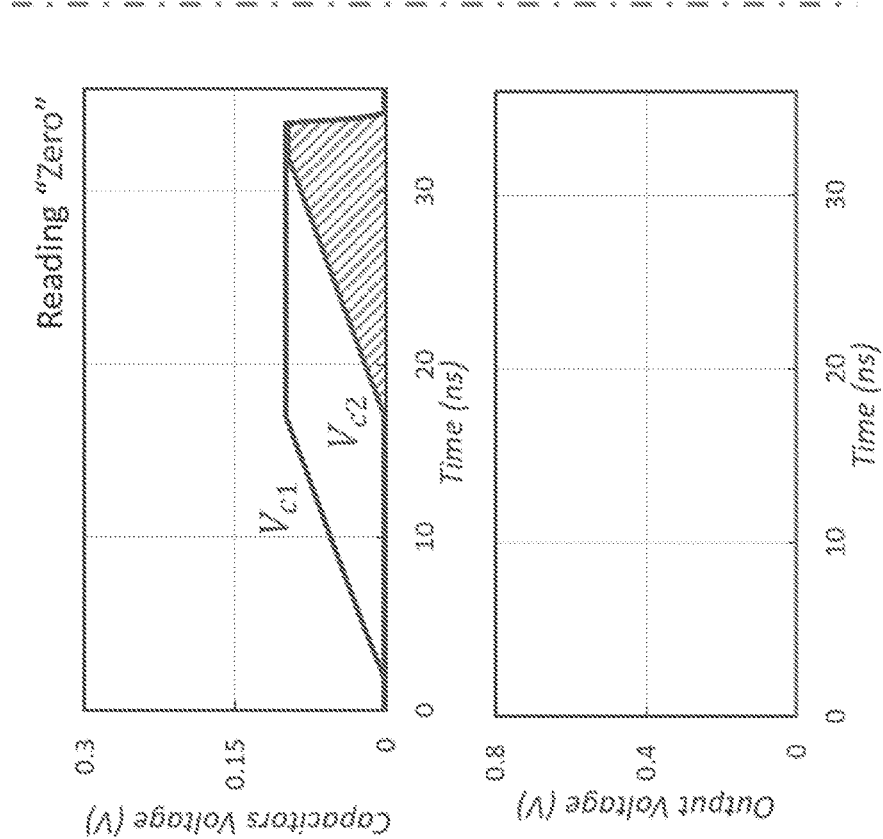
Figure 10B
Figure 10A

COMPENSATED READOUT OF A MEMRISTOR ARRAY, A MEMRISTOR ARRAY READOUT CIRCUIT, AND METHOD OF FABRICATION THEREOF

CROSS-REFERENCE TO RELATED APPLICATIONS

The present application is a national phase entry of International Application No. PCT/IB2016/053540, filed Jun. 15, 2016, which claims priority to U.S. Provisional Patent Application No. 62/180,675, filed Jun. 17, 2015. Both of these applications are incorporated herein by reference in their entireties.

TECHNOLOGICAL FIELD

An example embodiment of the present invention relates to reading memory and, more particularly, to compensated readout of a memristor memory array.

BACKGROUND

Memristor memories are resistive-based memories, where data is stored in the form of high and low resistances. Compared to capacitive based-memories, which are volatile, resistive memories are non-volatile and thus retain their state for long periods of time (on the order of years. This eliminates the need for the energy-consuming refresh cycles required by current complementary metal-oxide-semiconductor (CMOS) memories. Moreover, memristors may reduce the energy and time consumption of a startup stage of computer systems. In addition, memristors have other advantages, such as a high ON/OFF ratio and very high array density. Such high array-density may enable the memristors to be a very attractive option for future memories and solid state drives. In spite of all these attractive properties, there are many challenges that need to be addressed before the memristor genuinely replaces current memory technologies.

Memristor memory can be built using either gated or gateless memory cells, where each type of memristor has its own advantages and shortfalls. Gateless cells may provide the highest density memristor arrays, and may have a simple fabrication process, where each memory cell is just a thin film 102a located at each intersection of two crossbars 104, as shown in FIG. 1A. This is equivalent to a memristor device connecting the row and the column at their intersection, as shown in FIG. 1B. However, the gateless architecture suffers from sneak current, which is an undesired current that flows through the memory cells parallel to the desired memory cell and significantly impacts the readout operation. In addition, the sneak current significantly increases the power consumed by the memory array. Several techniques were proposed to enable a functional gateless memristor memory, such as multiport, multistage, and unfolded array readouts. However, these techniques either slow down the readout process, or impact the array density significantly.

A transistor-gated memristor array tries to mimic the classical dynamic random-access memory (DRAM) architecture, by associating a transistor 106 with each memristor memory element active film 102b, which may be implemented as an extra layer in the source or gate of the transistor (e.g., access transistor), as shown in FIG. 1C and equivalent circuit FIG. 1D. The introduced access transistor cuts the undesired sneak-paths of the current and reduces the total power consumption. However, this improvement may cause the array density to decrease as it will be dominated by the transistor footprint. While a smaller transistor may be used to maintain the high density advantage, a significant problem that arises for the smaller transistor is that the leakage current can prevent the memory array from working correctly.

BRIEF SUMMARY

A method for readout of a gated memristor array, a memristor array readout circuit, and a method of fabrication thereof are provided in accordance with example embodiments of the invention.

An example method for readout of a gated memristor array includes selecting a row of a memristor array associated with a desired memory cell, measuring the value of the selected memristor row, and selecting a column of a memristor array associated with the desired memory cell. The selection of the column and selection of the row selects the desired memory cell. The method also includes measuring the value of the memristor selected row with the selected desired memory cell and determining the value of the desired cell based on the value of the selected memristor row and the value of the selected memristor row with the selected desired memory cell.

In some embodiments of this method, the memristor array includes transistor gated memory cells. In some embodiments of the method, determining the value of the desired memory cell further includes subtracting the current of the selected memristor row from the current of the selected memristor row with the selected desired memory cell. In some embodiments of the method, measuring the value of the selected row of the memristor array also includes charging a first capacitor, measuring the value of the selected row of the memristor array with the selected desired memory cell also includes charging a second capacitor, and determining the value of the desired memory cell further includes comparing the value of the first capacitor and the value of the second capacitor.

In some embodiments of the method, the comparator is a hysteresis comparator. In some embodiments of the method, comparing the values of the first and second capacitors further includes inputting values of the first and second capacitors into a comparator. The output value of the comparator may correlate to the value of the desired memory cell. In some embodiments of the method, measuring the value of the row of the memristor array also includes activating a first transistor. In this regard, the first transistor may be configured to control the charging path of the first capacitor. In further embodiments, measuring the value of the row of the memristor array with the selected desired memory cell also includes activating a second transistor. The second transistor may be configured to control the charging path of the second capacitor.

In some embodiments of the method, the value of the selected memristor row and the value of the selected memristor row with the selected desired memory cell is a current value. In some embodiments, the method also includes resetting a readout circuit after determining the value of the desired memory cell. In some such embodiments of the method, resetting the readout circuit also includes discharging a plurality of capacitors.

In another example embodiment, a circuit is provided including first and second transistors configured to sample a selected row of a memristor array, a third transistor configured to activate a charging path for a first capacitor, and a fourth transistor configured to activate a charging path for a second capacitor. The first capacitor is configured to be charged by a current associated with a first sample and the second capacitor is configured to be charged by a current associated with a second sample. The circuit also includes a comparator configured to compare values of the first and second samples.

In some embodiments, the circuit also includes a fifth transistor configured to discharge the first capacitor and a sixth transistor configured to discharge the second capacitor. In some embodiments of the circuit, the first and second transistors are configured as a two resistor current mirror. In some embodiments of the circuit, the memristor array comprises transistor gated memory cells. In some embodiments of the circuit, the first sample is associated with a selected row of the memristor that does not comprise a selected memory cell, and the second sample is associated with a selected row of the memristor array that does comprise a selected memory cell.

In some embodiments of the circuit, the comparator is a hysteresis comparator. In some embodiments of the circuit, the comparator is a Schmitt-trigger comparator. In some embodiments of the circuit, the output value of the comparator correlates to the value of the selected memory cell. In some embodiments of the circuit, a selected memory cell value of 1 is associated with a high output value from the comparator, and a selected memory cell value of 0 is associated with a low output value.

In a further example embodiment, a method of fabricating a circuit is provided. This fabrication method includes providing first and second transistors configured to sample a selected row of a memristor array, providing first and second capacitors, providing a third transistor configured to activate a charging path for the first capacitor, and providing a fourth transistor configured to activate a charging path for the second capacitor. The first capacitor is configured to be charged by a current associated with a first sample and the second capacitor is configured to be charged by a current associated with a second sample. The method of fabricating a circuit also includes providing a comparator configured to compare value of the first and second samples.

In some embodiments, the method of fabricating the circuit also includes providing a fifth transistor configured to discharge the first capacitor and providing a sixth transistor configured to discharge the second capacitor. In some embodiments of the fabrication method, the first and second transistors are configured as a two resistor current mirror. In some embodiments of the fabrication method, the memristor array includes transistor gate memory cells. In some embodiments of the fabrication method, the first sample is associated with a selected row of the memristor that does not include a selected memory cell. In contrast, the second sample may be associated with a selected row of the memristor array that does include a selected memory cell.

In some embodiments of the fabrication method, the comparator is a hysteresis comparator. In some embodiments of the fabrication method, the comparator is a Schmitt-trigger comparator. In some embodiments of the fabrication method, the output value of the comparator correlates to the value of the selected memory cell. In some embodiments of the fabrication method, a selected memory cell value of 1 is associated with a high output value from the comparator, and a selected memory cell value of 0 is associated with a low output value.

BRIEF DESCRIPTION OF THE DRAWINGS

Figure 1B:
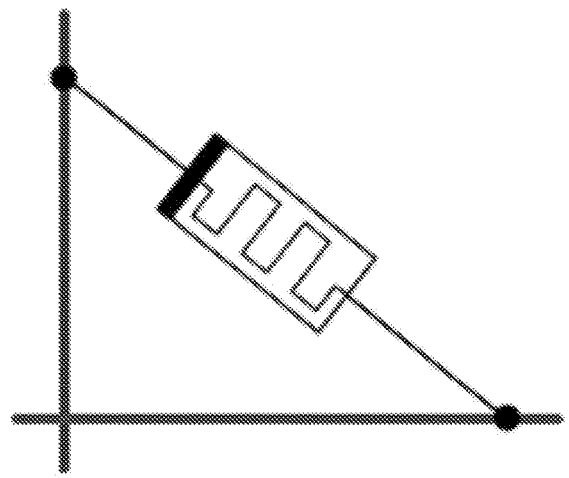
Figure 1A:
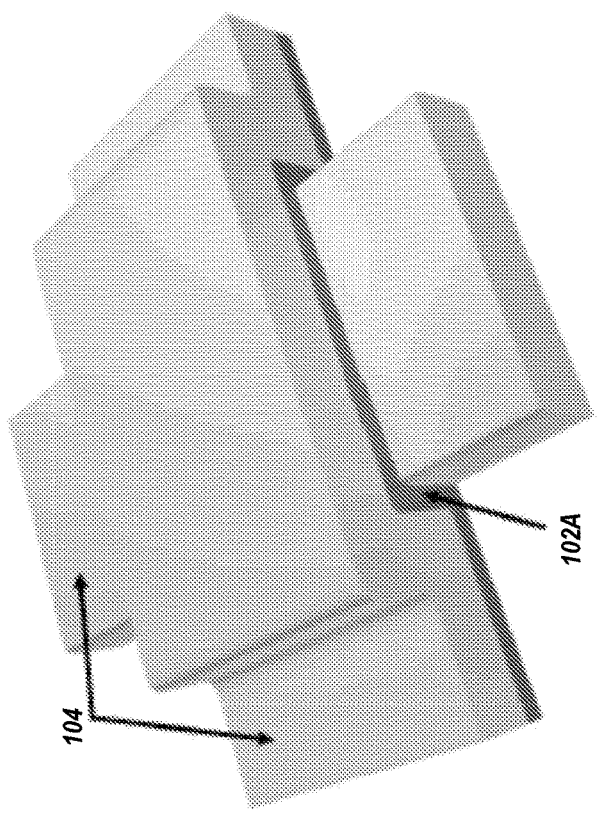
Figure 2B:
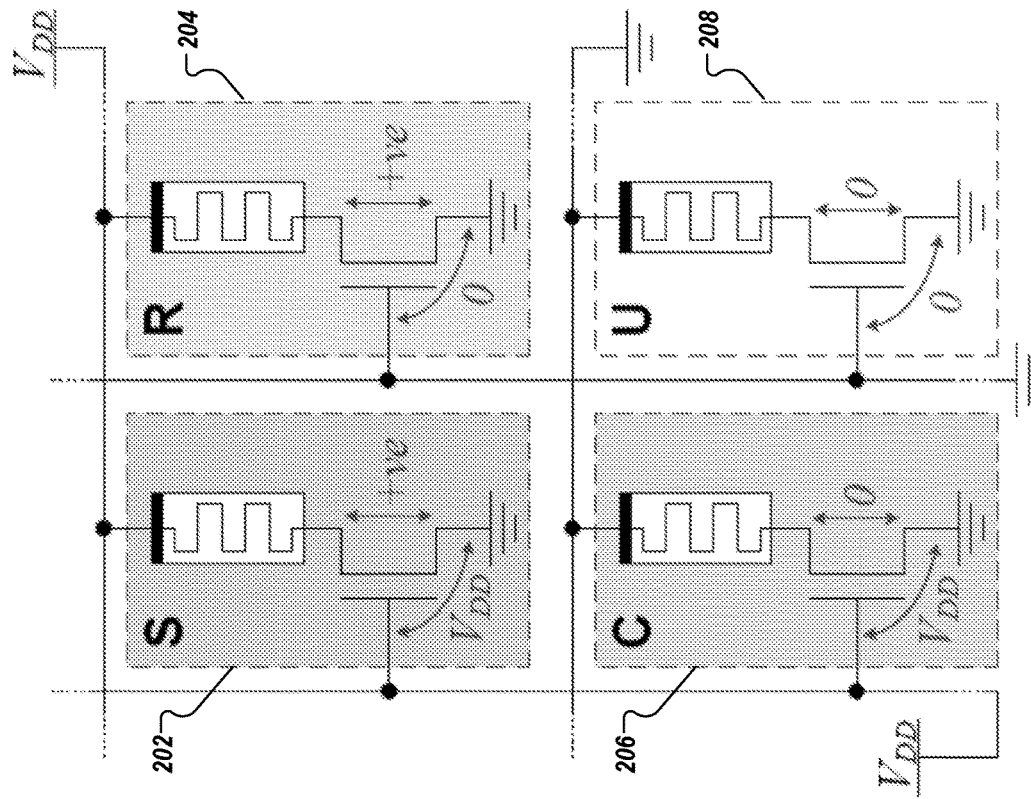
Figure 2A:
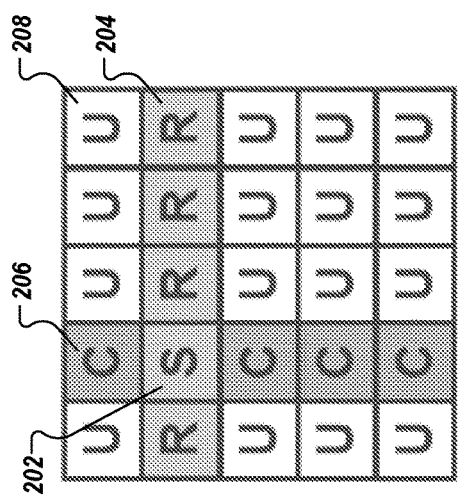
Figure 3:
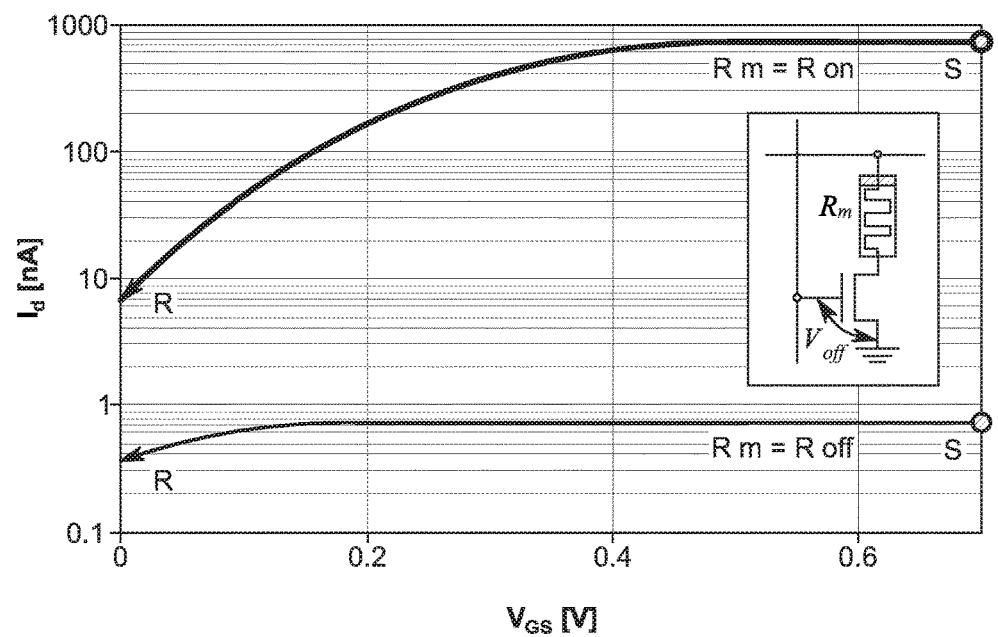
Figure 4:
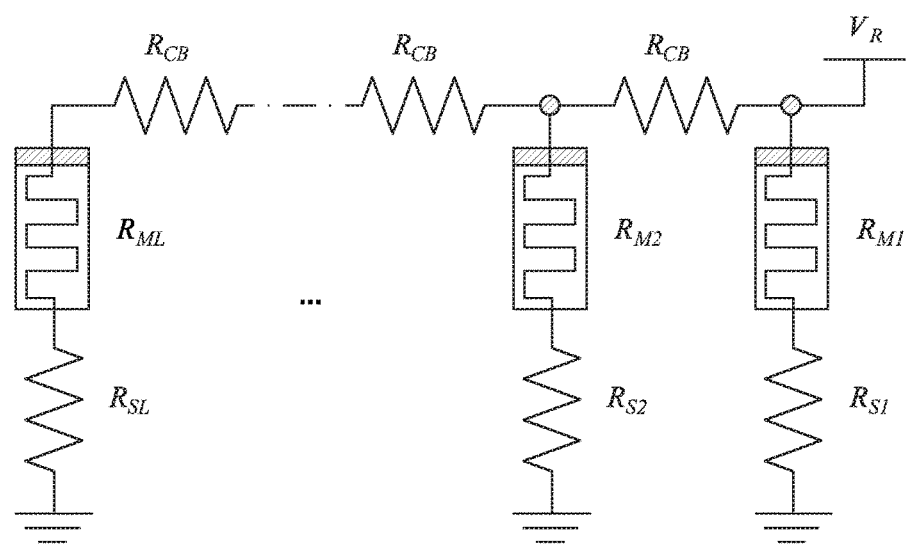
Figure 5:
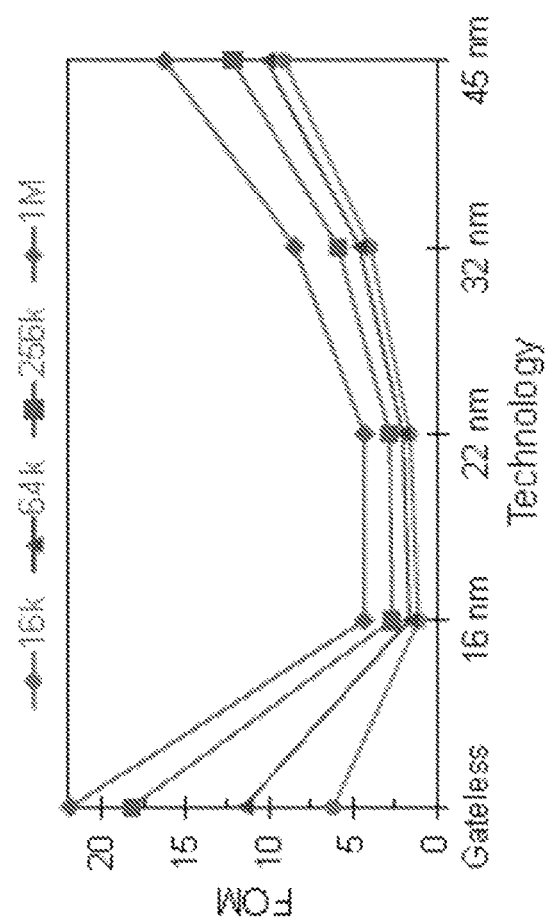
Figure 8:
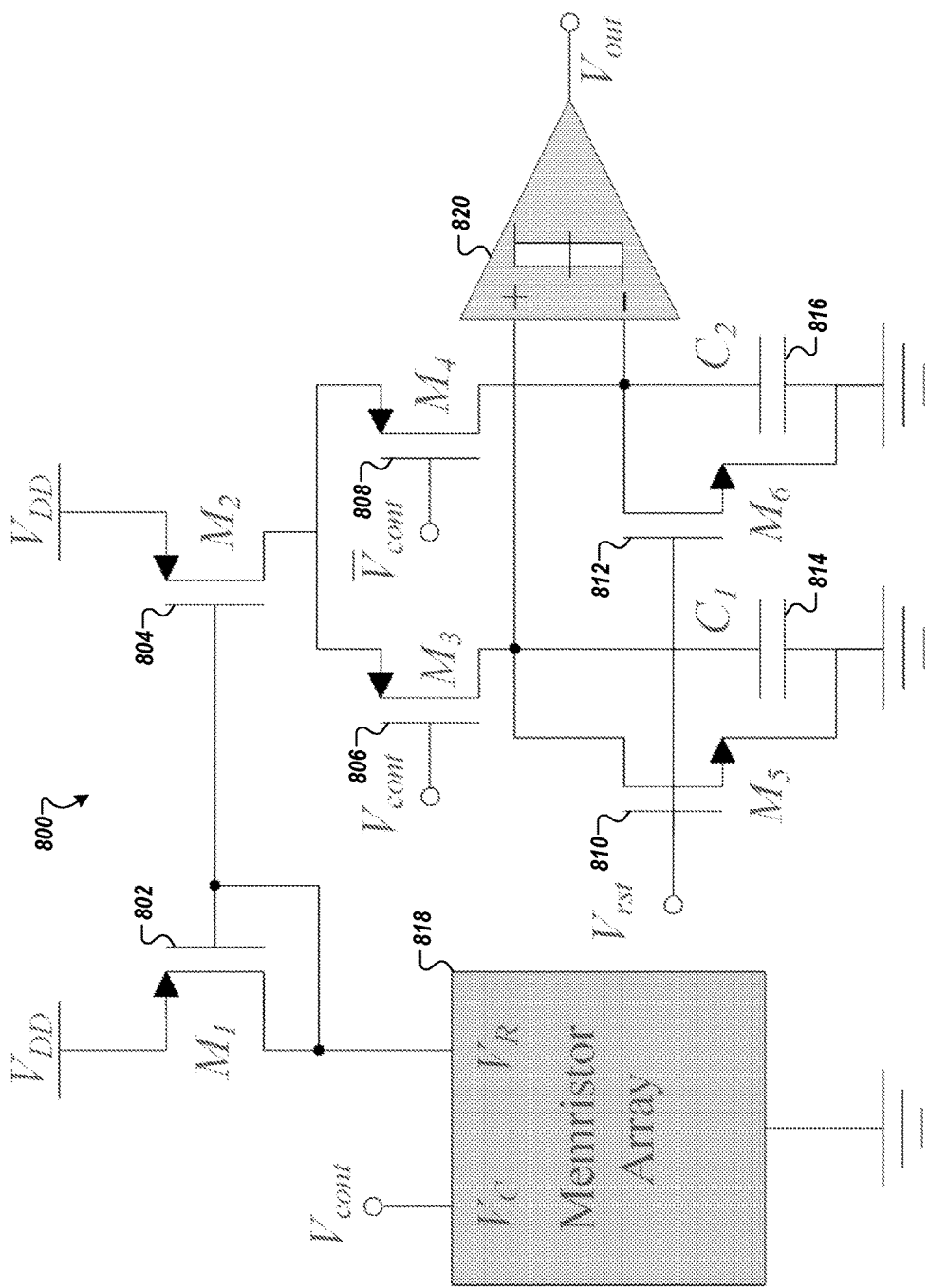
Figure 9:
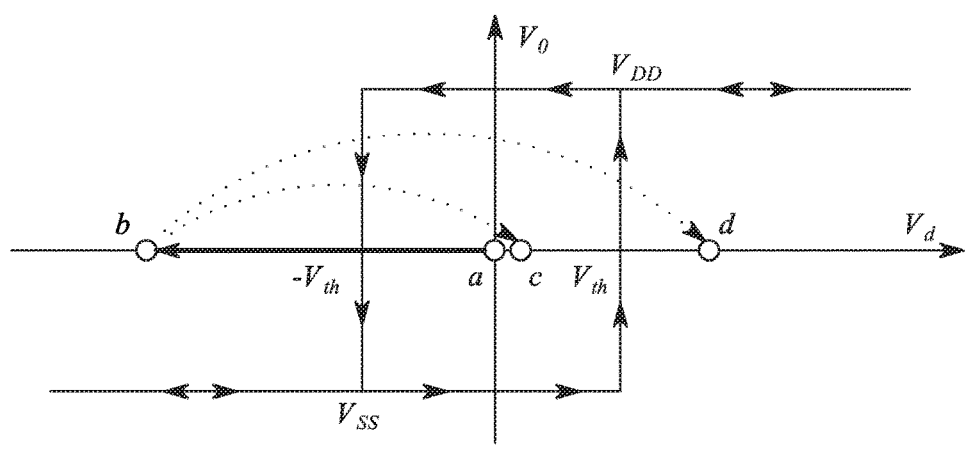
Figure 11:
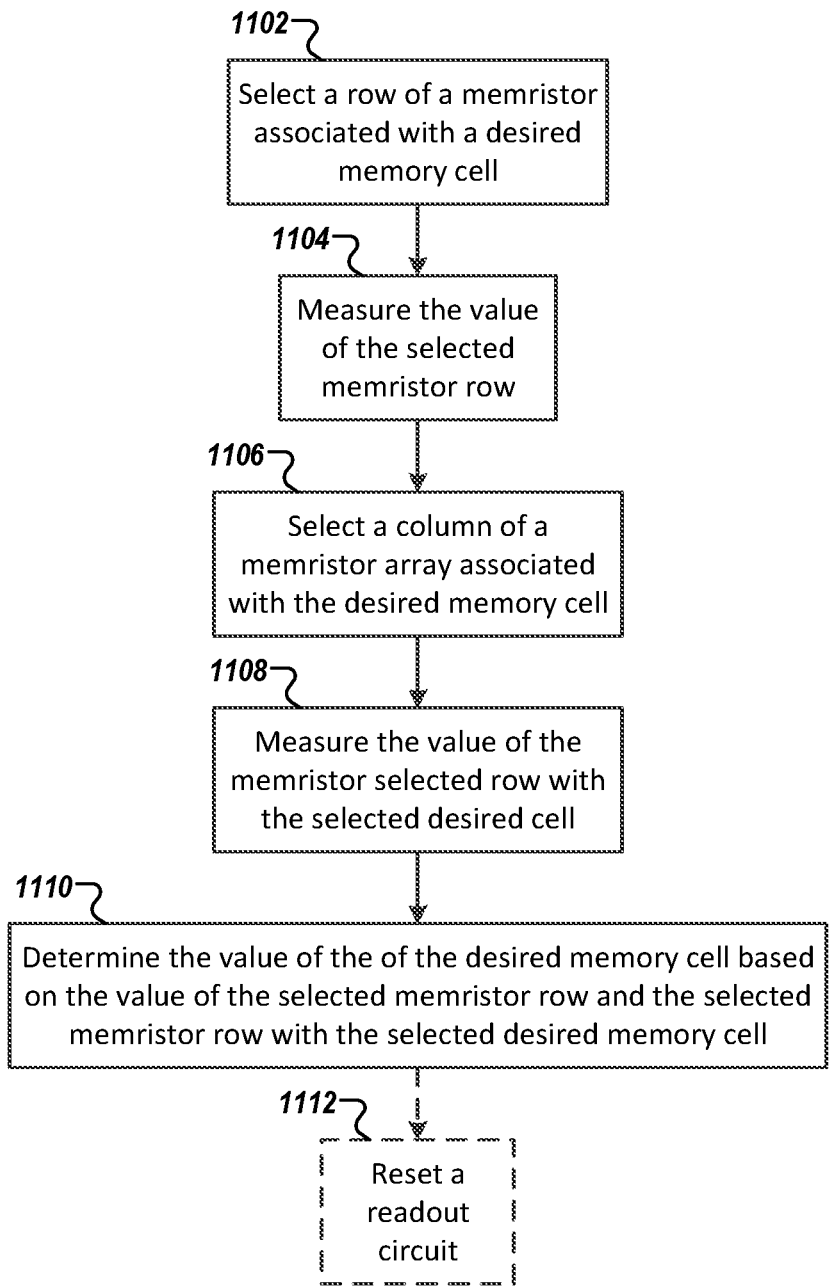
Figure 12:
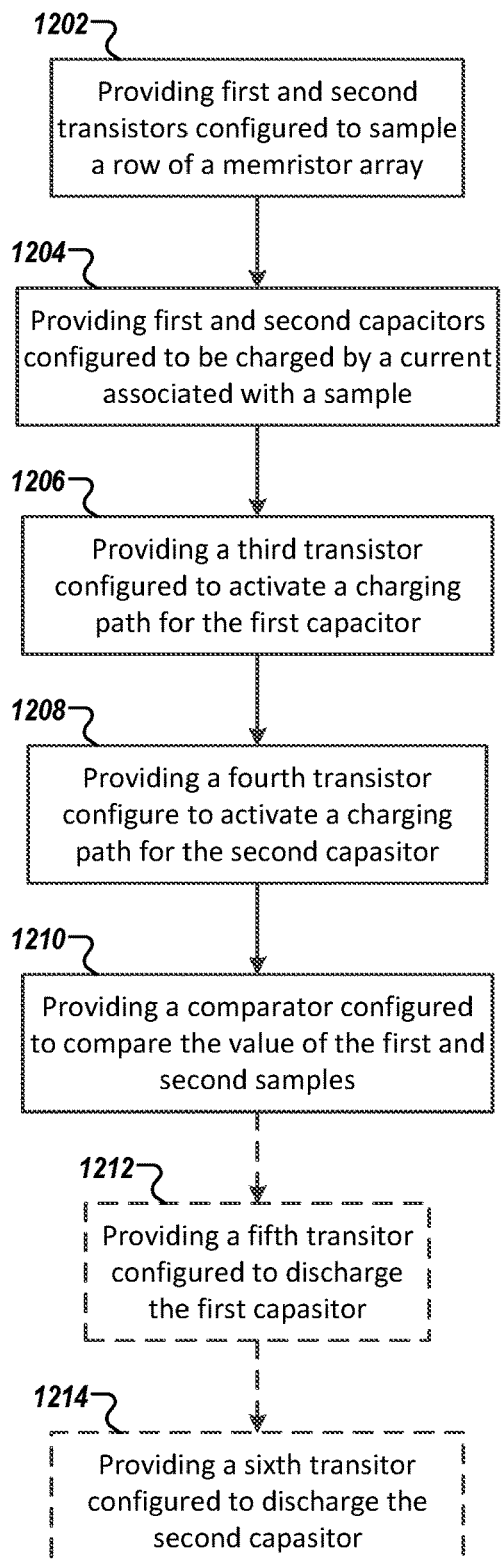

Having thus described example embodiments of the invention in general terms, reference will now be made to the accompanying drawings, which are not necessarily drawn to scale, and wherein:

FIG. 1A illustrates an example embodiment of a gateless memristor memory cell, in accordance with an example embodiment of the present invention;

FIG. 1B illustrates an example embodiment of an electrically equivalent circuit of a gateless memristor memory cell, in accordance with an example embodiment of the present invention;

FIG. 1C illustrates a transistor gated memristor memory cell, in accordance with an example embodiment of the present invention;

FIG. 1D illustrates two electrically equivalent circuits of a transistor gated memristor memory cell, in accordance with an example embodiment of the present invention;

FIG. 2A illustrates the four sets of memory cells during a readout operation, in accordance with an example embodiment of the present invention;

FIG. 2B illustrates the biasing conditions of the four types of memory cells, in accordance with an example embodiment of the present invention;

FIG. 3 illustrates a transistor current gate voltage for a single memory cell for an access transistor, in accordance with an example embodiment of the present invention;

FIG. 4 illustrates an example equivalent circuit for a memristor array during readout, in accordance with an embodiment of the present invention;

FIG. 5 illustrates an example Figure-of-Merit (FOM) versus access transistor size for a memristor array, in accordance with an embodiment of the present invention;

FIGS. 6A-D illustrate a transistor gated memristor array at different technology nodes, in accordance with an embodiment of the present invention;

FIGS. 7A and 7B illustrate example current intervals and normalized readout noise margins for different technology nodes, in accordance with an embodiment of the present invention;

FIG. 8 illustrates an example readout circuit, in accordance with an embodiment of the present invention;

FIG. 9 illustrates the operation of a readout circuit, in accordance with an embodiment of the present invention;

FIGS. 10A and 10B illustrate the transient readings for capacitor voltage and output voltage for a memory cell, in accordance with embodiments of the present invention;

FIG. 11 illustrates an example process for readout of a gated memristor array, in accordance with an embodiment of the present invention; and FIG. 12 illustrates an example process for fabricating a memristor array readout circuit, in accordance with an embodiment of the present invention.

DETAILED DESCRIPTION

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout.

In an example embodiment a method for readout of a gated memristor array, a memristor array readout circuit and method of fabrication thereof are provided. The readout circuit may compensate for leakage current in a high density metal-oxide-semiconductor (MOS) gated transistor memristor array. Leakage current is an undesired current that flows through switched OFF (e.g., non-gated) transistors. The leakage current may act as parasitic current for a crossbar array. The leakage current may increase as transistor size is scaled down, therefore becoming more significant for smaller technology nodes. In general, circuits built using smaller access transistors suffer from a higher static power component. In the case of a gated memristor array, resistive sensing may be used to read the stored data in a specific memory cell, where the binary data is stored in the form of high and low resistance values. The leakage current of other memory cells may corrupt readings, since the undesired leakage current acts as a parallel parasitic resistance to the desired cell.

A high-density gated memristor array may share several attributes with current DRAM memories. Each memory cell of a high-density gated memristor array may be made of an access transistor and a memory element, as depicted in FIGS. 1C and 1D. Each of these memory cells may be accessed through a single row and a single column, where the desired cell is located at the intersection. One difference between the high-density gated memristor array and a DRAM memory is the physical property representing the data. In the case of the DRAM capacitive sensing may be used, while memristor memories may employ a resistive sensing. During a readout operation, each memory cell falls under one of four types, as shown in FIG. 2A. The four memory cell types are:

S: the selected cell 202;
R: half-selected row cells 204, of which there are L−1 cells;
C: half-selected column cells 206, of which there are L−1 cells; and
U: unselected cells 208, of which there are $(L-1)^2$ cells, where L is the array length. The half-selected memory cells may be a source of the leakage current in a memristor array. For the half selected row memory cells 204, the access transistor may have a positive voltage drain to source (Vds) while its voltage gate to source (Vgs) may be zero, as shown in FIG. 2B. A leakage current may flow from the drain to the ground in the half selected row memory cells 204. On the other hand, the half selected column memory cells 206 may have access transistors with zero Vds and Vgs equal to voltage drain (VDD), as shown in FIG. 2B (which depicts the biasing conditions of the four types of memory cells). The leakage current of the half selected column memory cells 206 flows from the gate towards the ground. The leakage current of the two half-selected memory cell types (half selected row memory cells 204 and half selected column memory cells 206) contribute to power consumption, but only the half selected row memory cells may affect the reading operation. In an example embodiment with a less dense architecture (e.g., where two columns or rows are used per each memory cell), the half-selected column memory cells 206 could impact the readout process as well.

To read the desired memory cell, resistive sensing may be performed between the desired row and the ground. Leakage current from the desired row may act as a parallel parasitic resistance to the desired memory cell, causing erroneous readings. Additionally, the parasitic resistance may depend on the data stored in the memory, since the leakage current of a single memory cell depends on the value of the memristor resistance.

Example Transistor Current Versus Gate Voltage for a Single Memory Cell

FIG. 3 illustrates a transistor current gate voltage for a single memory cell for the access transistor. In an example embodiment, a 16 nanometer (nm) access transistor may be used for the memory array gates, memory selectors, and readout circuit. The value of the drain current depends on the state of the memristor (e.g., $R_{on}(1)$ or $R_{off}(0)$). In one embodiment, the horizontal axis $V_{gs}$ may range from 0-0.7V. In this embodiment, the vertical axis is the access transistor current $(I_d)$ and may range from 0.1 to 1000 nanoAmps (nA) (logarithmic scale). In this embodiment, the access transistor current for a memristor memory cell with a value of $R_{on}$ md may have a positive slope from approximately 7 nA at 0V to approximately 700 nA at 0.7V. The access transistor current for a memristor memory cell with a value of $R_{on}$ may have a positive slope from approximately 0.4 nA at 0V to approximately 0.6 nA at 0.1V and be relatively constant at 0.7 nA from 0.1-0.7V.

The desired current (at Vgs=$V_{DD}$) may be much higher than the leakage current (at Vgs=VDD). However, the sum of the leakage current from all half-selected row memory cells 204 may have an aggregate effect.

Example Equivalent Circuit of a Memristor Array During Readout

FIG. 4 illustrates an example equivalent circuit for a memristor array during readout. The equivalent circuit for the memristor array may be a resistive ladder network. The ladder legs may represent the desired memory cell 202 and the parallel half-selected row memory cells 204. Each memory cell may be represented by a gate resistance ($R_{Si}$), in series with the memristor resistance ($R_{Mi}$). A memristor's resistance may be data dependent, while all the row memory cells are half selected, except the desired memory cell gate which may be fully selected. The resistance of a half-selected access transistor may depend on the series memristor resistance, since the series resistance sets the drain-source voltage drop on the access transistor. If the crossbar resistance effect ($R_{cb}$) is negated, an approximated expression describing the circuit may be $$R_{read} = R_{cell} // R_{leakage} \qquad (1)$$

where $R_{read}$ is the equivalent readout resistance, $R_{cell}$ is the desired cell resistance, and $R_{leakage}$ is equivalent resistance for the rest of the half selected row memory cells which are all in parallel and given by $$R_{leakage} = \frac{R_{on} R_{off} R_{hso} R_{hsz}}{O_n R_{off} R_{hsz} + (L - O_n - 1) R_{on} R_{hso}} \qquad (2)$$

where $R_{on}$ and $R_{off}$ are the ON and OFF (e.g., 1 and 0) resistances of the memristor, $O_n$ is the number bits storing ones ($R_{on}$) in the half selected row memory cells, and $R_{hso}$ and $R_{hsz}$ are the half-selected access transistor resistances in series with $R_{on}$ and $R_{off}$, respectively.

Example Figure of Merit Versus Gate Transistor Size for Various Memristor Array Sizes One design consideration for a memristor memory array is the tradeoff between the array density and its power consumption. The highest density is achieved by the gateless memristor array, since no gate elements are used. However, for the same reason the gateless memristor array consumes a large amount of energy, since current will sneak freely throughout the memristor array. Introducing a gate element reduces both the power consumption and the array density, which may be directly proportional to the to the access transistor area. Larger access transistors may limit the current to the desired cell only, while smaller transistors will not affect the area significantly, but may have significant leakage current.

FIG. 5 illustrates a graph of Figure-of-Merit (FOM) versus access transistor size for an example memristor array. The vertical axis is the FOM ranging from 0-25. FOM may be determined according to the following equation:

$$\text{FOM} = P_r \times A_c, \quad (3)$$

where $P_r$ is the average power consumed by the array during the readout process, for a memory filled up with checkered (e.g., alternating "1s" and "0s") data pattern and $A_c$ is the memory cell area. The horizontal axis is the access transistor size ranging from gateless to 45 nm. Four memristor array sizes are depicted, having respective sizes of 16 kilobytes (k), 64 k, 256 k, and 1 megabyte (M). The 16 k memristor array has approximate FOMs of 6 at gateless, 1 at 16 nm, 2 at 22 nm, 4 at 32 nm, and 9 at 45 nm. The 64 k memristor array has approximate FOMs of 11 at gateless, 2 at 16 nm, 2.5 at 22 nm, 5 at 32 nm, and 10 at 45 nm. The 256 k memristor has approximate FOMs of 18 at gateless, 4 at 16 nm and 22 nm, 6 at 32 nm, and 12 at 45 nm. The 1 M memristor has approximate FOMs of 22 at gateless, 5 at 16 nm and 22 nm, 8 at 32 nm and 15 at 45 nm.

Smaller transistors may have a better FOM for a low power consumption and a high memristor array density. However, small transistors may also suffer relatively high leakage current.

Example Leakage Current Effect on Readout Noise Margins

Leakage current may act as a random variable added to the desired memory cell current value. The leakage may act as a source of noise in addition to thermal noise. Therefore, the readout noise margins of the readout circuit may decrease or be reduced to zero. This may cause each of the two binary states of a memory cell (e.g., "1" or "0") to be represented by intervals, rather than a single value. The width of each interval may define the severity of the leakage current. In a bounding case scenario, where the memory can be completely filled with "all zeros" or "all ones", the current interval width can be approximated as:

$$\Delta \approx V_{DD}(L-1)\left[\frac{1}{R_{on}R_{hso}} - \frac{1}{R_{off}R_{hsz}}\right]. \quad (4)$$

The readout noise margins decrease as $\Delta$ increases, until the regions representing the "0" value and the "1" value overlap. In such case, it may be impossible to use the classic readout technique to get an error free output, even with a theoretical absence of thermal noise.

FIGS. 6A through 6D illustrate a transistor gated memristor array at different technology nodes (e.g., access transistor gate sizes) for a 256 k and 1M memristor array. The intervals representing both "1" and "0" are depicted and how they may increase and overlap as transistor gate size decreases. FIGS. 6A and 6C depict the results using the National Institute of Standard and Technology (NIST) data, which may represent the real workload the memristor array will face during operation. The NIST data includes 1080 data points for each of the 256 k and 1024 k memristor arrays.

In addition, FIGS. 6B and 6D depict the boundary conditions in which the memristor array may be filled with "all ones" and "all zeros", since the maximum leakage current is consumed in the case of "all ones" and the minimum in the case of "all zeros". The readout noise margins depicted have been reduced to zero and the "1" and "0" intervals overlap for the smaller transistor size, and even for the larger transistors in the 1M memristor array. A good (e.g., high) FOM may only be desirable in an instance with a functional memory and high noise margins. In an example embodiment the memristor array hierarchy may include banks, blocks, and sub-blocks to increase the memory bandwidth and reduce the parasitic effects, such as the capacitive loading of long crossbars. In some example embodiments, additional techniques may be used to reduce the effective size of an array, such as, folding arrays and open digiline.

As shown in FIGS. 6A-6D, the interval $\Delta$ increases with the memristor array length, where the array area is square its length. FIG. 7A depicts a semi-log plot for the current interval representing binary "1" for different technology nodes (e.g., access transistor size) versus the memory array length. The increase of $\Delta$ is accompanied by a decrease in the noise margins as shown in FIG. 7B. FIG. 7B depicts the circuit readout noise margins versus the memory array length. The readout noise margins may be inversely proportional to the memory array size (e.g., as the array size increases, the noise margins decreases), where negative margins represent overlap between the intervals. The readout technique of an example embodiment of the present invention may eliminate the leakage current effect and restore the readout noise margins.

In an example embodiment, the memristor array may be fabricated for memory applications and may be engineered to have a writing threshold. In an instance in which the memristor array is engineered with a writing threshold, half selected cells may have a very small voltage drop across the memristor array. In an example embodiment in which the memristor array is threshold-less, the small leakage current per cell may drift the stored values, and a low rate refresh cycles may be desirable.

Example Compensated Readout Technique and Readout Circuit

It may be difficult to avoid leakage current in a high-density memristor array, although it is possible to compensate for the effects of leakage current on the readout. In an example embodiment, a readout technique is provided in order to restore the noise margins and eliminate the leakage-current effect. This readout may dynamically sense the leakage current during each readout operation, since the parasitic current may be data dependent. In an example readout circuit, a current sensing technique is utilized. A current mirror, such as a two transistor current mirror, may reflect the consumed current in the desired row. The mirrored current may be a direct measure of the readout resistance. As discussed above in FIG. 2, readout resistance may be composed of two parallel components: the desired cell resistance and the leakage current resistance. The parasitic leakage current may be removed from the readout by employing a two phase readout mechanism. In a first phase, only the leakage current may be captured (e.g., sampled). A row of the memristor array containing the desired memory cell may be activated (e.g., selected) and no array columns of the memristor array is selected. As a result, the memory cells of the selected row may be half-selected including the desired memory cell. The current captured in phase one ($I_{p1}$) may reflect the leakage current with a small positive shift of the current added by the half-selected desired cell. The first phase current may be given as $$I_{p1} = I_{dh} + I_{leakage}, \quad (5)$$

where $I_{dh}$ is the current consumed by a half-selected desired cell.

In the second phase, the desired row current is captured while the desired cell is fully selected (e.g., the column of the memristor array including the desired memory cell is activated). This current may be given as:

$$I_{p2} = I_{df} + I_{leakage}, \quad (6)$$

where $I_{df}$ is the desired current consumed by a fully selected desired cell. The difference between the current of the first phase and second phase may be equivalent to the desired current with a shift of a single memory cell leakage current, rather the leakage current of hundreds of memory cells.

Example Readout Circuit

FIG. 8 illustrates an example readout circuit 800 in accordance with an example embodiment of the present invention. In this example, a memristor array 818 is electrically connected to a control voltage $V_{cont}/V_C$ that is configured to select a desired row and/or column of the memristor array. Transistors M1 802 and M2 804 are provided to sample the current of the desired row of the memristor array 818. Transistors M1 802 and M2 804 may be configured as a two-transistor current mirror, electrically connected to the memristor array 818 sensing a voltage reading ($V_R$). The two transistor current mirror, M1 802 and M2 804, may also be electrically connected to power supply VDD. Transistors M3 806 and M4 808 may activate a charging path to one of two capacitors C1 814 and C2 816. Transistors M3 806 and M4 808 may be electrically connected to transistor M2 804 and to capacitors C1 816 and 816 respectively. Transistors M3 814 and M4 816 may be activated (e.g., gated by a control voltage ($V_{cont}$)). A comparator 820 may be provided to compare the voltage drop of capacitors C1 814 and C2 816. The comparator 820 may be a hysteresis comparator with inputs electrically connected to C1 814 and C2 816. The output of the comparator ($V_{out}$) may be the difference in voltage between C1 814 and C2 816. Transistors M5 810 and M6 812 may be provided to reset capacitors C1 814 and C2 816. Transistors M5 810 and M6 may be electrically connected in parallel with capacitors C1 814 and C2 816. Transistors M5 810 and M6 812 may be activated by a reset voltage ($V_{rst}$), which discharges the capacitor voltage to ground. Discharging the voltage of capacitors C1 and C2 may reset the readout circuit 800 for the next reading cycle.

In an example embodiment, the memristor array may be configured with 16 nm access/gate transistors. Transistors M1-M6 may have the following dimensions: M1: 32 nm/32 nm, M2: 256 nm/64 nm, M3: 16 nm/16 nm, M4: 16 nm/16 nm, M5: 64 nm/16 nm, and M6: 64 nm/16 nm. Capacitors C1 and C2 may have a capacitance value of 50 femtofarads (fF).

Example Operation of a Readout Circuit

FIG. 9 illustrates the operation of an example embodiment of the readout circuit 800. Initially, the readout circuit 800 starts at point 'a', where the two capacitors C1 814 and C2 816 are discharged. During the first phase of operation, capacitor C1 814 is charged with the leakage current. The applied voltage on the comparator 814, which in an example embodiment may be a Schmitt-trigger comparator, ($V_d = V_{c1} - V_{c2}$) decreases reaching point 'b' (e.g., pre-charge point), thereby resetting the comparator output (e.g., $V_{out}$). A comparator 820 threshold may be selected such that $V_{th} < |V_b|$.

During the second phase of operation, capacitor C2 816 is charged with the leakage current and the current of the fully selected desired memory cell. The voltage of capacitors C1 814 and C2 816 may be input to comparator 820. In an instance in which the desired memory cell stores a "0" (high resistance), the added desired current may pull back the comparator voltage to point 'c', which is inside the hysteresis region, and the output may remain at $V_{SS}$. In an instance in which the desired memory cell stores a "1" (low resistance), a higher current may be observed, which may shift the operating point to 'd'. The output of the comparator $V_{out}$ may be $V_{DD}$.

In an instance in which the capacitors start to discharge, the input voltage of the comparator may start to decrease, approaching zero voltage. However, the output may not be affected due to the comparator hysteresis. The threshold voltage may be selected to achieve balanced noise margins, illustrated by the equation:

$$V_{th} = \frac{(V_c + V_d)}{2} \approx \frac{I'_{on} \cdot T_p}{2 \cdot C_1}, \quad (7)$$

where $I'_{on}$, may be the mirrored current in case of only desired current is consumed by ON cell, $T_p$ may be the time period of either phase one or two, and $V_c$ and $V_d$ may be the voltage at points 'c' and 'd' respectively.

FIGS. 10A and 10B illustrate the transient readings for capacitor voltage and output voltage for a memory cell storing a "0" or "1" respectively. In an example embodiment, the memristor array may be a full gated memristor array of 256 k. The graphs illustrated in FIGS. 10A and 10B depict four time periods: a first time period where the readout circuit is at rest; a second time period during the charging phase of C1 814 (e.g., leakage current associated with the half selected row of the memristor array); a third time period during the charging phase of C2 (e.g., the current of the half selected row including the selected desired memory cell); and a fourth time period during the comparison of C1 814 and C2 816 voltage by the comparator 820. The graphs in FIG. 10A illustrate the transient readings for a memory cell storing a "0" and the graphs provided in FIG. 10B illustrate the transient readings for a memory cell storing a "1." The top graphs in FIGS. 10A and 10B depict capacitor C1 and C2 voltages ranging from 0-0.3 V over time 0-35 ns, and the graphs on the bottom depict the output voltages of the comparator 820 ranging from 0-0.8V over the same time period.

The capacitor voltage graph for the "0" memory cell, shown in FIG. 10A, depicts a 0V for C1 814 and C2 816 during the first time period (0-2 ns). During the second time period (e.g., 2-17 ns), the voltage of C1 increases linearly form 0-0.1V, while the voltage of C2 remains constant at 0V. During the third time period (e.g., 17-32 ns), the voltage of C2 816 increases linearly from 0-0.1V. The voltages of C1 and C2 are constant during the fourth period (e.g., 32-34 ns), at 0.1V. At 34 ns, capacitors C1 814 and Cs 816 are discharged, as depicted by the steep negative slope returning both voltages to 0V. Referring to the comparator 820 output voltage graph, the output voltage remains constant at 0V from 0-36 ns.

The capacitor voltage graph for the "1" memory cell, e.g. FIG. 10B depicts a 0V for C1 814 and C2 816 during the first period (0-2 ns). During the second time period (e.g., 2-17 ns), the voltage of C1 increases linearly form 0-0.1V, while the voltage of C2 remains constant at 0V. During the third time period (e.g., 17-32 ns), the voltage of C2 816 increases linearly from 0-0.3V. The voltages of C1 and C2 are constant during the fourth period (e.g., 32-34 ns), at 0.1V and 0.3V respectively. At 34 ns, capacitors C1 814 and Cs 816 are discharged, as depicted by the steep negative slope returning both voltages to 0V. Referring to the comparator 820 output voltage graph, the output voltage remains constant at 0V from 0-25 ns. The output voltage rises linearly from 0-0.7V from 25-25.5 ns. The output voltage remains constant at 0.7V from 25.5-36 ns.

The leakage discharge current of C1 during the charging of C2 may be insignificant, as depicted in FIGS. 10A and 10B. It should be understood that the readout times depicted in FIGS. 10A and 10B are for illustration purposes only and other readout time may be utilized, including faster readout times.

Example Process for Readout of a Gated Memristor Array

Referring now to FIG. 11, a process for readout of a gated memristor array is illustrated. As shown in block 1102 of FIG. 11, a row of a memristor array, such as memristor array 818, associated with a desired memory cell is selected. A control voltage may gate the access transistors associated with the selected row. In an example embodiment, the memristor array 818 includes memory cells with access transistors. These access transistors may be 16 nm, 22 nm, 32 nm, 45 nm, or the like.

As shown in block 1104 of FIG. 11, a value of the selected memristor row may be measured (e.g., sampled). In an example embodiment, a first capacitor, such as capacitor C1 814 may be charged by the current (e.g., leakage current) associated with the selected row of the memristor array 818. In an example embodiment, capacitor C1 814 may be charged by gating a transistor, such as transistor M3 806, which may activate a charging path from a two transistor current mirror, such as M1 802 and M2 804 configured to sample the current of the selected row of the memristor array 818.

As shown at block 1106 of FIG. 11, a column of a memristor array 818 associated with a desired memory cell may be selected. A control voltage may gate access transistors associated with the selected column. The selection of a column and row associated with a desired memory cell may select the desired memory cell.

As shown at block 1108, of FIG. 11, a value of the selected row with the selected desired memory cell may be measured (e.g., sampled). In an example embodiment, a capacitor such as C2 816 may be charged by the current (e.g., leakage current) and current associated with selected desired memory cell of the memristor array 818. In an example embodiment, C1 may be charged by gating a transistor, such as transistor M4 808, which may activate a charging path from a two transistor current mirror, M1 802 and M2 804, configured to sample the current of the selected row of the memristor array 818.

As shown at block 1110 of FIG. 11, the value of the desired memory cell may be determined. The value of the desired memory cell may be determined by comparing the value of the selected memristor 818 row and the selected memristor row with the selected desired memory cell. In an example embodiment a comparator, such as comparator 820 may receive an input voltage from capacitors C1 814 and C2 816. In some example embodiments, the comparator may be a hysteresis comparator. In an example embodiment, the comparator may be a Schmitt-trigger comparator.

The output of the comparator may correspond to the value of the desired memory cell. In an example embodiment, in an instance in which the selected cell value is "1" the output value of the comparator may be a high voltage, such as 0.7V. In an example embodiment in which the selected cell value is "0", the output value of the comparator may be a low voltage, such as 0 or 0.1V.

As shown at block 1112 of FIG. 11, the readout circuit may be reset for a subsequent reading. It should be understood that the readout circuit does not need to be fully reset after each readout. For instance, when the subsequent reading will be for a cell adjacent to the cell that was just read (which is a typical situation in memory readout operations), the charge stored on C1 can be reused and thus C1 need not be discharged. For that matter, the charge stored on C1 can be reused for all of the cells in the same row. Nevertheless, in situations in which a readout circuit reset is desired, the readout circuit may be reset by discharging capacitors C1 816 and C2 818. In some example embodiments, capacitors C1 816 and C2 818 may be discharged by gating transistors, such as transistors M5 810 and M6 812, to ground.

Process for Fabricating a Memristor Array Readout Circuit

Referring now to FIG. 12, a process for fabricating a memristor array readout circuit is illustrated. As shown in block 1202 of FIG. 12, first and second transistors may be provided. The first and second transistors, such as transistors M1 802 and M2 804, may be configured to sample a row of the memristor array 818.

As shown in block 1204 of FIG. 12, first and second capacitors may be provided. The first and second capacitors, such as capacitors C1 816 and C2 818, may be configured to be charged by a current associated with first and second samples respectively. In an example embodiment, the first sample may be associated with a selected row of a memristor array and the second sample may be associated with a selected memristor row with a selected memory cell.

As shown in block 1206 of FIG. 12, a third transistor may be provided. The third transistor, such as transistor M3 806, may be configured to activate a charging path for the first capacitor C1 814.

As shown in block 1208 of FIG. 12, a fourth transistor may be provided. The fourth transistor, such as transistor M4 808, may be configured to activate a charging path for the second capacitor C2 816.

As shown in block 1210 of FIG. 12, a comparator may be provided. The comparator, such as comparator 820, may be configured to compare the values of the first and second samples. In an example embodiment, the comparator 820 may be a hysteresis comparator. In some example embodiments, the comparator 820 may be a Schmitt-trigger comparator.

The output of the comparator may correspond to the value of the desired memory cell. In an example embodiment, in an instance in which the selected cell value is "1", the output value of the comparator may be a high voltage, such as 0.7V.

In an example embodiment in which the selected cell value is "0", the output value of the comparator may be a low voltage, such as 0 or 0.1V.

As shown in block 1212 of FIG. 12, a fifth transistor may be provided. The fifth transistor, such as transistor M5 810, may be configured to discharge the first capacitor C1 816.

As shown in block 1214 of FIG. 12, a sixth transistor may be provided. The sixth transistor, such as transistor M6 812, may be configured to discharge the first capacitor C1 818. Discharging the first and second transistors may reset the circuit for subsequent memristor array 818 readouts.

The readout circuit may compensate for leakage current in memristor arrays utilizing small access transistors. This may allow for high density gated memristor arrays to be used in various computing applications with significantly smaller size and power consumption than traditional memories.

As described above, FIGS. 11 and 12 illustrate flowcharts including operations for fabricating a memristor array readout circuit and a process for readout of a gated memristor array according to example embodiments of the invention. In some embodiments, certain ones of the operations above may be modified or further amplified. Furthermore, in some embodiments, additional optional operations may be included, such as illustrated by the dashed outline of block 1112, 1212, and 1214 in FIGS. 11 and 12. Modifications, additions, or amplifications to the operations above may be performed in any order and in any combination.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A method comprising:
    selecting a row of a memristor array associated with a desired memory cell;
    measuring a value of a leakage current associated with the selected memristor row;
    selecting a column of a memristor array associated with the desired memory cell, wherein the selection of the column and the selection of the row selects the desired memory cell;
    measuring a value of (1) the leakage current associated with the memristor selected row and (2) a current associated with the selected desired cell; and
    determining a value of the desired memory cell based on (1) the value of the leakage current of the selected memristor row and (2) the value of the current of the selected desired memory cell,
    wherein the leakage current associated with the memristor selected row and the current associated with the selected desired cell are measured with first to fourth transistors and first and second capacitors.

2. The method of claim 1, wherein the memristor array comprises transistor gated memory cells.

3. The method of claim 1, wherein, determining the value of the desired cell further comprises:
    subtracting a current of the selected memristor row from a current of the selected memristor row with the selected desired memory cell.

4. The method of claim 1,
    wherein measuring the value of the selected row of the memristor array further comprises charging the first capacitor,
    wherein measuring the value of the selected row of the memristor array with the selected desired memory cell further comprises charging the second capacitor, and
    wherein determining the value of the desired memory cell further comprises comparing the value of the first capacitor and the value of the second capacitor.

5. The method of claim 4,
    wherein the measuring the value the row of the memristor array further comprises activating the first transistor, wherein the first transistor is configured to control a charging path of the first capacitor, and
    wherein the measuring the value of the row of the memristor array with the selected desired memory cell further comprises activating the second transistor, wherein the second transistor is configured to control a charging path of the second capacitor.

6. The method of claim 1, further comprising:
    resetting a readout circuit after the determining the value of the desired memory cell.

7. A circuit comprising;
    first and second transistors configured to sample a selected row of a memristor array;
    a third transistor configured to activate a charging path for a first capacitor;
    a fourth transistor configured to activate a charging path for a second capacitor,
    wherein the first capacitor is configured to be charged by a current associated with a first sample,
    wherein the second capacitor is configured to be charged by a current associated with a second sample; and
    a comparator configured to compare value of the first and second samples.

8. The circuit of claim 7 further comprising:
    a fifth transistor configured to discharge the first capacitor; and
    a sixth transistor configured to discharge the second capacitor.

9. The circuit of claim 7, wherein the first and second transistors are configured as a two resistor current mirror.

10. The circuit of claim 7, wherein the memristor array comprises transistor gated memory cells.

11. The circuit of claim 7,
    wherein the first sample is associated with a selected row of the memristor, wherein the selected row of the memristor does not comprise a selected memory cell, and
    wherein the second sample is associated with a selected row of the memristor array, wherein the selected row of the memristor array comprises a selected memory cell.

12. The circuit of claim 7, wherein the comparator comprises a hysteresis comparator or a Schmitt-trigger comparator.

13. The circuit of claim 7, wherein an output value of the comparator correlates to the value of the selected memory cell.

14. A method of fabricating a circuit comprising:
providing first and second transistors configured to sample a selected row of a memristor array;
providing first and second capacitors;
providing a third transistor configured to activate a charging path for the first capacitor;
providing a fourth transistor configured to activate a charging path for the second capacitor,
wherein the first capacitor is configured to be charged by a current associated with a first sample,
wherein the second capacitor is configured to be charged by a current associated with a second sample; and
providing a comparator configured to compare value of the first and second samples.

15. The method of fabricating a circuit of claim 14 further comprising:
providing a fifth transistor configured to discharge the first capacitor; and
providing a sixth transistor configured to discharge the second capacitor.

16. The method of fabricating a circuit of claim 14, wherein the first and second transistors are configured as a two resistor current mirror.

17. The method of fabricating a circuit of claim 14, wherein the memristor array comprises transistor gate memory cells.

18. The method of fabricating a circuit of claim 14,
wherein the first sample is associated with a selected row of the memristor, wherein the selected row of the memristor does not comprise a selected memory cell, and
wherein the second sample is associated with a selected row of the memristor array, wherein the selected row of the memristor array comprises a selected memory cell.

19. The method of fabricating a circuit of claim 14, wherein the comparator comprises a hysteresis comparator or a Schmitt-trigger comparator.

20. The method of fabricating a circuit of claim 14, wherein an output value of the comparator correlates to the value of the selected memory cell.

* * * * *